United States Patent
Kanemaru et al.

(10) Patent No.: US 6,483,164 B1
(45) Date of Patent: Nov. 19, 2002

(54) SCHOTTKY BARRIER DIODE

(75) Inventors: Hiroshi Kanemaru, Kanagawa (JP); Shinji Ogino, Kanagawa (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 09/611,634

(22) Filed: Jul. 7, 2000

(30) Foreign Application Priority Data

Jul. 9, 1999 (JP) .......................................... 11-195458

(51) Int. Cl.[7] .............................................. H01L 31/00
(52) U.S. Cl. ..................... 257/453; 257/454; 257/473; 257/474; 257/478; 438/573; 438/571
(58) Field of Search ................ 257/453, 454, 257/473, 474, 478, 471, 472, 481, 485, 74, 78; 458/573, 571; 317/234, 237; 357/71

(56) References Cited

U.S. PATENT DOCUMENTS

| | | | | |
|---|---|---|---|---|
| 3,585,469 A | * | 6/1971 | Jäger et al. ................. | 317/234 |
| 3,699,408 A | * | 10/1972 | Shinoda et al. ............. | 317/237 |
| 4,213,840 A | * | 7/1980 | Omori et al. ................ | 204/192 |
| 4,811,069 A | * | 3/1989 | Kakinuma et al. ............ | 357/30 |
| 5,023,482 A | * | 6/1991 | Bellavance .................. | 307/456 |
| 5,789,311 A | * | 8/1998 | Ueno et al. .................. | 438/573 |

FOREIGN PATENT DOCUMENTS

| | | |
|---|---|---|
| JP | 59-124765 A | 7/1984 |
| JP | 40608768 Z * | 3/1994 |

* cited by examiner

Primary Examiner—Nathan J. Flynn
Assistant Examiner—Leonardo Andujar
(74) Attorney, Agent, or Firm—Rossi & Associates

(57) ABSTRACT

A Schottky electrode is formed of an alloy, which is composed of two or more kinds of metal materials in combinations that provide different Schottky barrier heights with respect to a semiconductor and that form no intermetallic compound.

9 Claims, 7 Drawing Sheets

|    | Sc | Er | Y | Ti | Mn | Zr | V | Cr | Co | Ni | Ta | Mo | Pt |
|---|---|---|---|---|---|---|---|---|---|---|---|---|---|
| Pt | ● | x | x | x | x | x | x | x | x | ● | x | x | |
| Mo | ● | ● | ● | ● | x | x | ● | ● | x | x | ● | | |
| Ta | ● | ● | ● | ● | ● | ● | ● | x | x | x | | | |
| Ni | x | x | x | ● | x | x | ● | x | | | | | |
| Co | x | x | x | x | ● | x | x | x | | | | | |
| Cr | ● | ? | x | ● | x | x | ● | | | | | | |
| V | ● | ● | ● | ● | ● | x | | | | | | | |
| Zr | ● | ● | ● | ● | x | | | | | | | | |
| Mn | ● | x | x | x | | | | | | | | | |
| Ti | ● | ● | ● | | | | | | | | | | |
| Y | ● | ● | | | | | | | | | | | |
| Er | ● | | | | | | | | | | | | |
| Sc | | | | | | | | | | | | | |

● MATERIAL THAT FORMS NO INTERMETALLIC COMPOUND x MATERIAL THAT FORMS AN INTERMETALLIC COMPOUND

FIG. 9

SCHOTTKY BARRIER DIODE

FIELD OF THE INVENTION

The present invention relates to a Schottky barrier diode (hereinafter abbreviated as an SBD), which is a semiconductor rectifying device utilizing a Schottky barrier formed on an interface of a metal and a semiconductor.

BACKGROUND

An SBD utilizing a Schottky barrier formed on an interface of a metal and a semiconductor has a trade-off relationship between forward characteristics and backward characteristics. It is therefore necessary to adjust the height (hereinafter referred to as $\phi b$) of the Schottky barrier [refer to P.378, S. M. Sze. "Physics of Semiconductor Devices"].

If a silicon wafer is used as a semiconductor substrate, $\phi b$ is controlled in the following two methods:

(1) A barrier metal is selected [in this case, an interface is an metal/silicon interface. Refer to, e.g., the above-mentioned "Physics of Semiconductor Devices"]; and (2) A silicide layer is controlled [in this case, the interface is a metal silicide/silicon interface. For example, refer to Odomari, Hara, Chikyo, Applied Physics, vol.56, (1987), pp.311–331, "Structure of Silicide/Silicon viewed with Electronic Standards"]

In the first method (1), $\phi b$ ordinarily depends on a difference between a work function of the metal and an electron affinity of the semiconductor. The work function and the electron affinity are values that are specific to the materials. Therefore, $\phi b$ can be controlled to some extent by selecting a metal material, but it cannot be finely adjusted.

In the second method (2), a heat treatment forms the Schottky barrier on the metal silicide/silicon interface, not on the metal/silicon interface. The composition of the metal silicide depends on a heat treatment temperature, and thus, $\phi b$ can be changed according to the heat treatment temperature. The second method (2), however, is not universal since it is not easy to perform and there is a limitation on the materials.

In the above methods, a desired $\phi b$ cannot be acquired since it is determined by the work function specific to a single metal or the metal silicide.

It is therefore an object of the present invention to provide an SBD, which is able to adjust the forward characteristics and the backward characteristics by precisely controlling the barrier height $\phi b$.

SUMMARY OF THE INVENTION

The above object can be accomplished by providing an SBD comprising a barrier metal formed of an alloy, which is composed of two or more kinds of metal materials in combinations that provide different $\phi b$ with respect to a semiconductor and that form no intermetallic compound.

If an alloy composed of two kinds of metals A and B is an eutectic alloy, the alloy has such a structure that the metal A and the metal B are mixed very finely. Thus, the SBD having the barrier metal formed of such an alloy has an intermediate $\phi b$ between barrier heights of the SBDs, which are formed of single metals. For this reason, adjusting the composition of the alloy enables the SBD to have $\phi b$ that cannot be achieved by a single metal, and makes it possible to precisely control electric characteristics.

A combination of two kinds of metals in an alloy constituting said barrier metal is a combination of scandium and erbium, yttrium (hereinafter referred to as Y), titanium (hereinafter referred to as Ti), manganese (hereinafter referred to as Mn), zirconium (hereinafter referred to as Zr), vanadium (hereinafter referred to as V), ciromium hereinafter referred to as Cr), tantalum (hereinafter referred to as Ta), molybdenunm (hereinafter referred to as Mo) or platinwn (hereinater referred to as Pt); a combination of erbium and Y, Ti, 7r, V, Ta or Mo; a combination of Ti and Zr, VY Cr, nickel (hereinafter referred to as Ni), Ta or Mo; a combination of M and V, cobalt or Ta; a combination of Zr and Ta; a combination of V and Cr, Ta or Mo; a combinton of Cr and Ni or Mo; a combination of Ni and Pt; or a combination of Ta and Mo.

If the alloy is composed of two or more metal materials in a combination that forms an intermetallic compound, the alloy has such a structure that one metal A or B and the intermetallic compound are finely mixed. The SBD having the barrier metal that is composed of such an alloy is considered to have an intermediate $\phi b$ between the metal A and the intermetallic compound. $\phi b$ of the intermetallic compound, however, does not necessarily take an intermediate value between the metal A and the metal B. Therefore, $\phi b$ of the alloy cannot be found from $\phi b$ of a single metal, and $\phi b$ of the alloy cannot be controlled. Likewise, $\phi b$ cannot be controlled in the case where there are many intermetallic compounds, because the intermetallic compounds may be finely mixed in the alloy.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 9 is a list of prospective barrier metal materials.

DETAILED DESCRIPTION OF THE PREFERRED EMBODIMENTS

[Embodiment 1]

First, Ti and Y were selected as a combination of metals that produce no intermetallic compound, and an SBD having a barrier metal formed of a Ti—Y alloy was experimentally manufactured.

Figure 3:
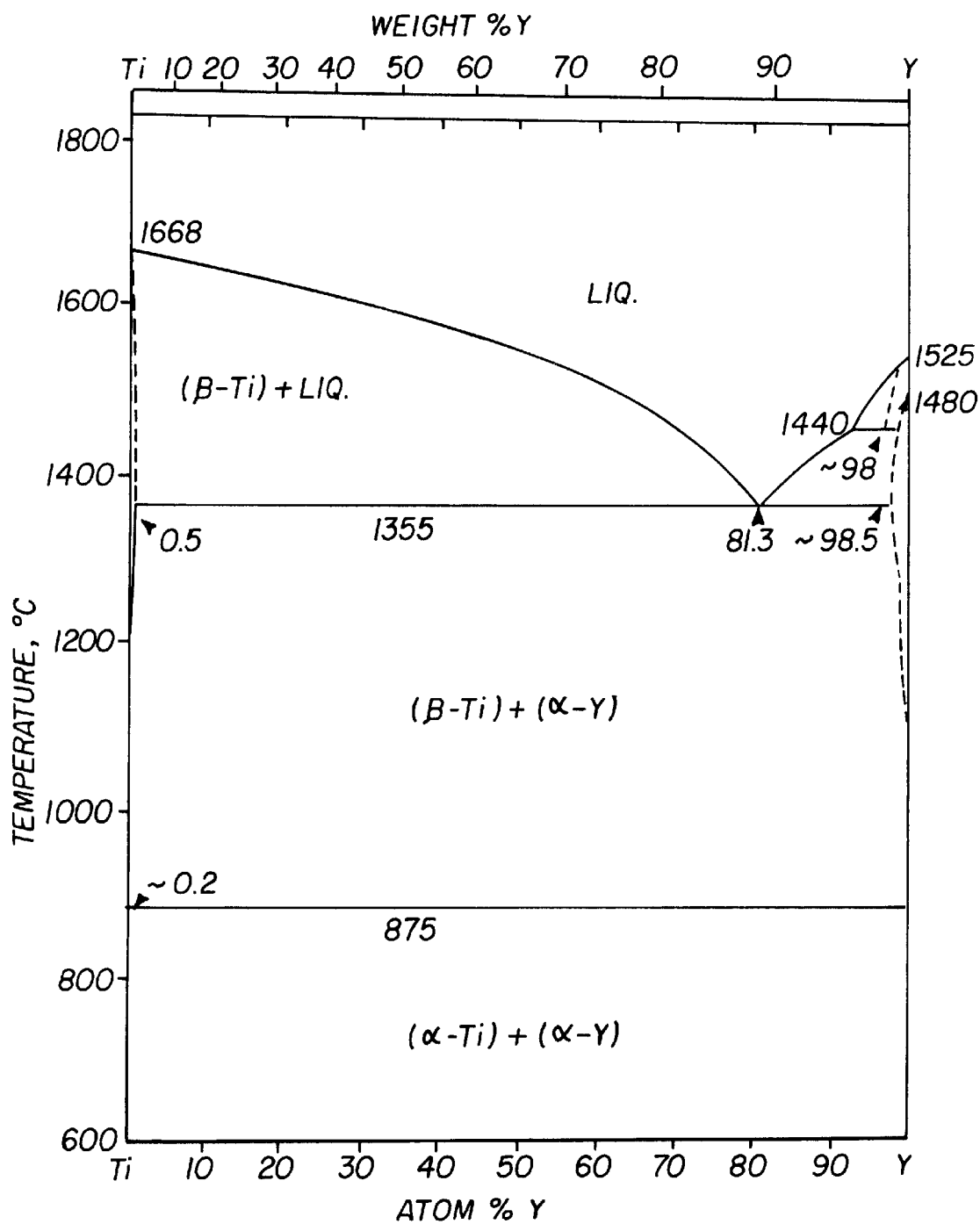
FIG. 3 is a diagram of a Ti—Y system.

FIG. 3 is a diagram showing a Ti—Y system [Dr. William G. Moffatt, "THE HANDBOOK OF BINARY PHSE DIAGRAMS" and others]. As is clear from FIG. 3, a Ti—Y system generates no intermetallic compound.

Figure 2:
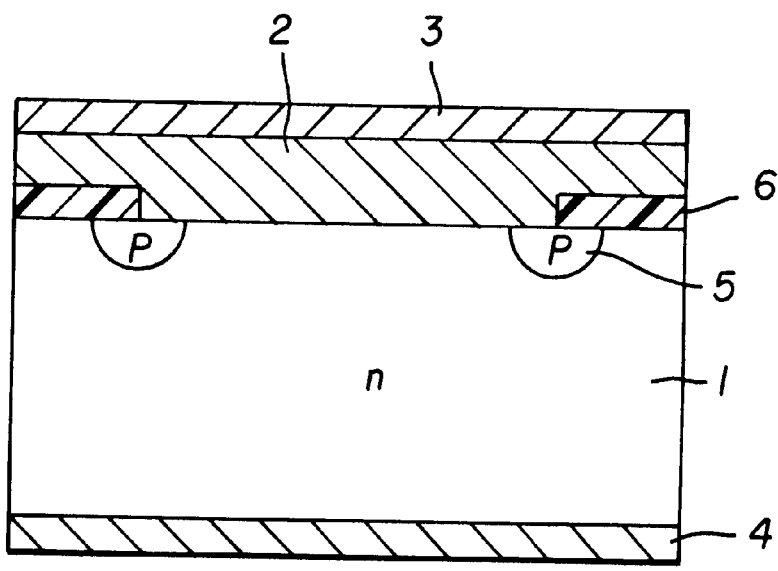
FIG. 2 is a cross-sectional view showing an SBD in which a Ti—Y alloy barrier is used.

FIG. 2 is a cross-sectional view of the SBD, in which the Ti—Y alloy is used for the barrier metal. The barrier metal 2 of the Ti—Y alloy is in contact with the surface of an n-type silicon substrate 1, and an Al electrode 3 covers the barrier metal 2. Reference numeral 4 denotes an ohmic electrode at the reverse side of the silicon substrate 1. Reference numeral 5 denotes a p-type guard ring that is formed in a surface layer of the silicon substrate 1. An oxide film 6 is formed at the outside of the p guard ring 5 on the surface of the silicon substrate 1.

A Ti—Y alloy film was formed as follows. A simultaneous vapor deposition using two vaporization sources of Ti and Y forms the barrier metal of the Ti—Y alloy. The composition of the Ti—Y alloy was controlled by vapor deposition rates, and samples of alloys composed of Ti and Y were experimentally produced at the following three ratios: Ti:Y=2:8, 4:6, 8:2. Then, a Ti/Ni/Au triplex film was formed as the ohmic electrode 4 at the reverse side of the barrier metal 2.

Figure 1:
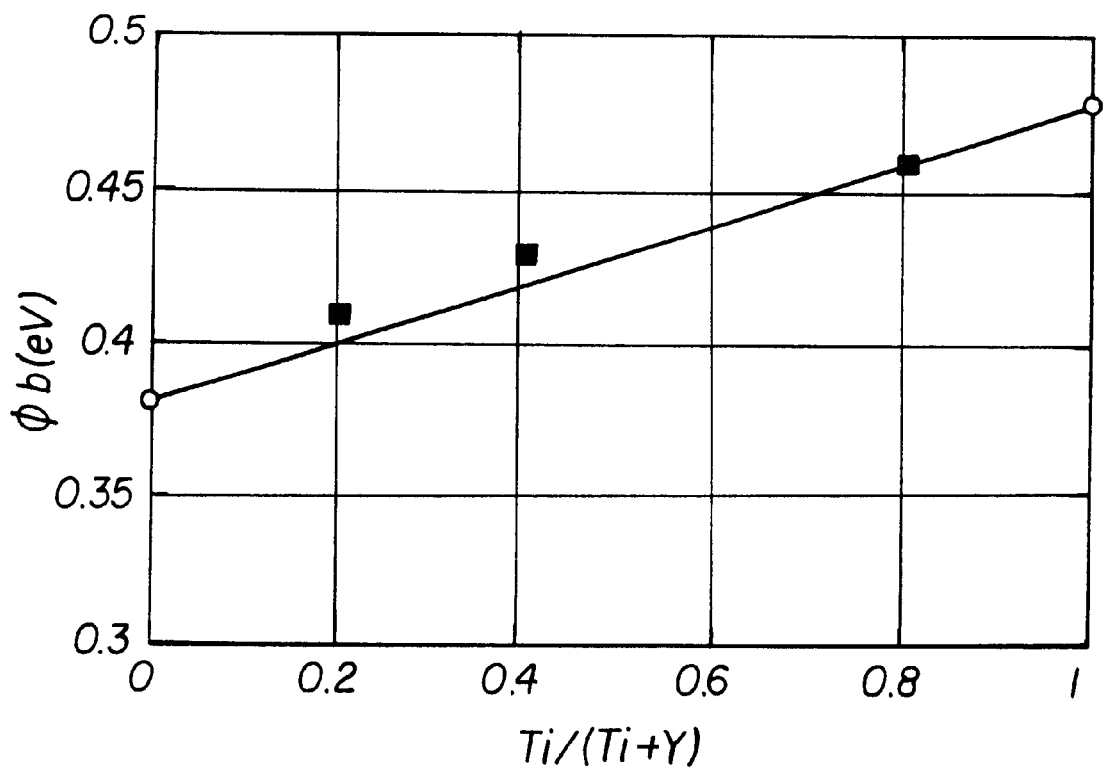
FIG. 1 is a characteristic drawing showing a relationship between the composition of an SBD in which a Ti—Y alloy barrier is used and $\phi b$.

FIG. 1 is a drawing showing the dependency of φb, which is calculated from current-voltage characteristics of the experimentally-manufactured SBD, on the composition of the Ti—Y alloy. For comparison, FIG. 1 also shows SBDs, in which Ti or Y is singly used for the barrier metal.

φb of the SBD, that is formed of the Ti—Y alloy at various vapor deposition rates (compositions), is substantially put on a straight line [φb(Ti$_x$Y$_{1-x}$)=xφb (Ti)+(1-x)φb(Y), 0≦x≦1].

Therefore, it was confirmed that φb could be controlled by changing the film composition of the Ti—Y alloy.

[Embodiment 2]

An SBD, in which a p-type silicon wafer is used instead of the n-type silicon wafer in the first embodiment, was experimentally manufactured. As is the case with the embodiment 1, the barrier metal was formed of the Ti—Y alloy by the vapor deposition method. As a result, it was confirmed that the SBD of the embodiment 2 had the same tendency as in FIG. 1, and that φb could be controlled by changing the composition of the Ti—Y alloy.

[Embodiment 3]

Then, Zr and Ta were selected as a combination of metals that form no intermetallic compound, and an SBD, in which a Zr—Ta alloy was used for a barrier metal, was experimentally manufactured.

Zr and Ta have a very low vapor pressure, and it is therefore difficult to deposit the barrier metal by the vapor deposition method. For this reason, the Zr—Ta alloy was formed by a spattering method. The composition of the alloy was changed by varying an area of a Ta target and a chip-shaped Zr target added onto the Ta target.

Figure 4:
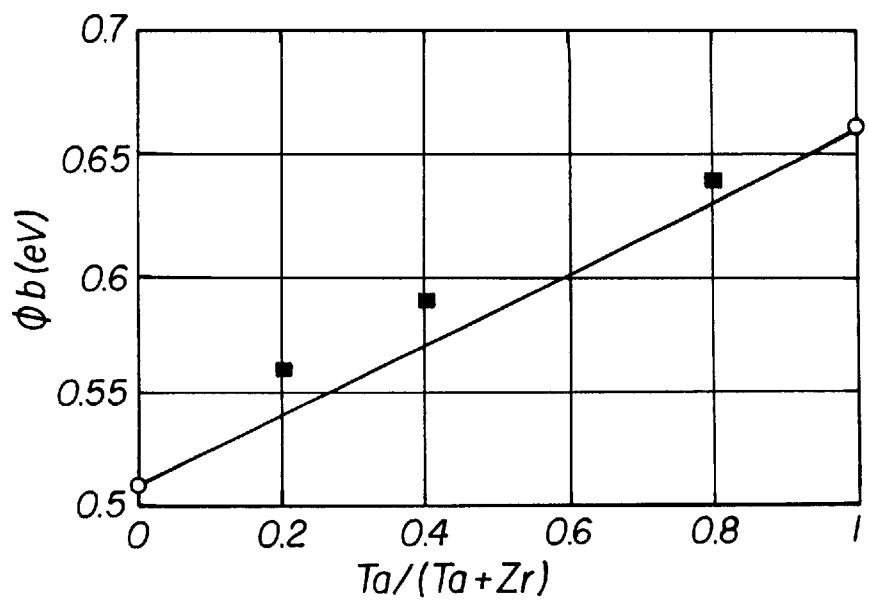
FIG. 4 is a characteristic drawing showing a relationship between the composition of an SBD, in which a Zr—Ta alloy barrier is used, and $\phi b$.

FIG. 4 is a characteristic drawing showing the dependency of φb, which is calculated from a current-voltage characteristic of the experimentally-manufactured SBD, on the composition of the Zr—Ta alloy. For comparison, FIG. 4 also shows SBDs in which Zr or Ta is singly used for the barrier metal.

The SBD in FIG. 4 has the same tendency as in FIG. 1, and φb of the SBD formed of the Zr—Ta alloy composed at various vapor sputtering rates (the composition) is substantially put on a straight line between φb of Zr 100% (Ta:0%) and φb of Ta 100% (Zr:0%) [φb(Zr$_x$Ta$_{1-x}$)=xφb(Zr)+(1-x)φb(Ta), 0≦x≦1]. Therefore, it was confirmed that φb could be controlled by changing the film formation speed (the composition) of the Zr—Ta alloy.

Figure 5:
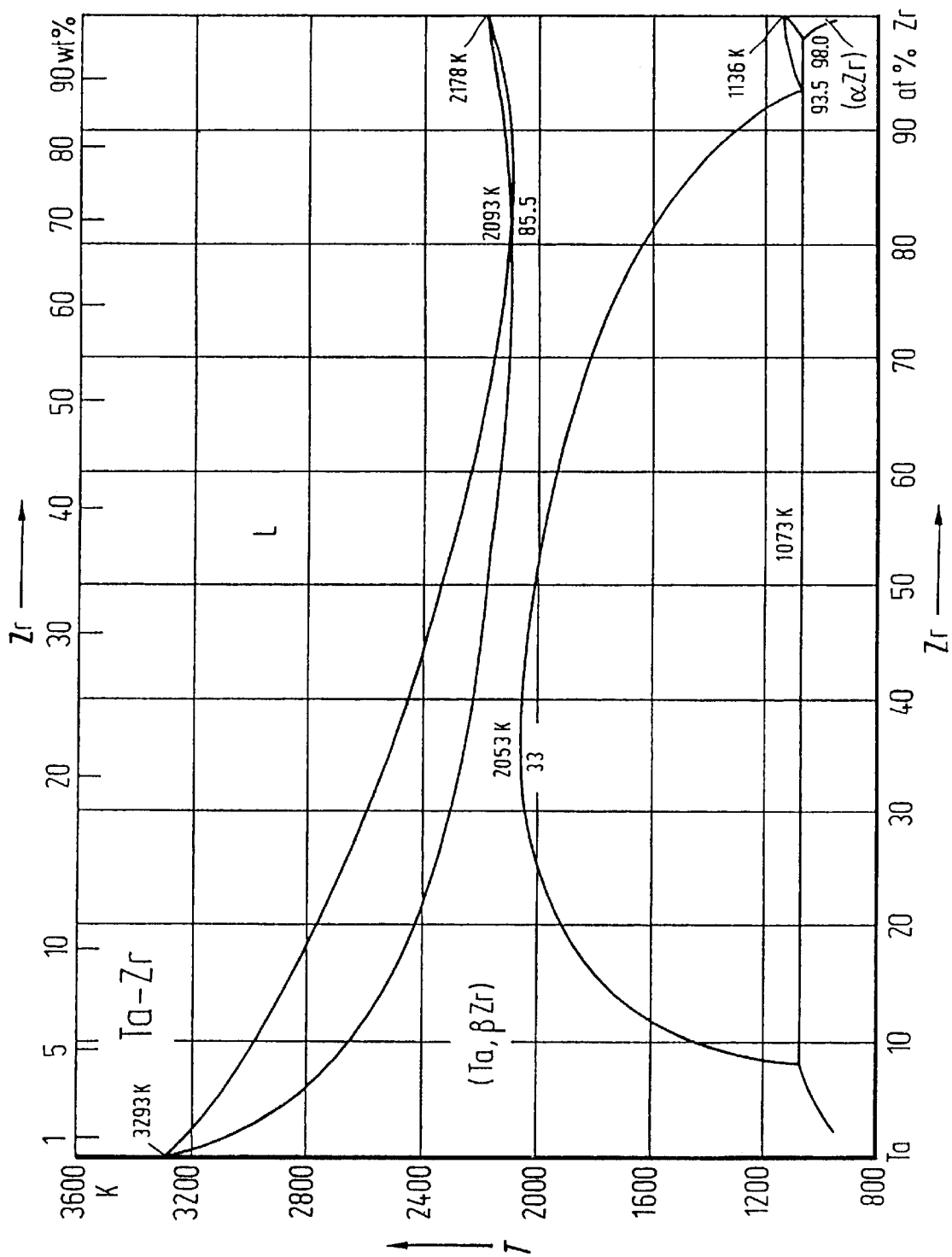
FIG. 5 is a diagram of a Zr—Ta system.

FIG. 5 is a diagram of a Zr—Ta system [the above-mentioned "THE HANDBOOK OF BINARY PHASE DIAGRAMS"]. As is clear from FIG. 5, the Zr—Ta system generates no intermetallic compound.

Comparative Example 1

Next, Mn and Y were selected as a combination of metals that form intermetallic compounds, and an SBD, in which an Mn—Y alloy is used for the barrier metal, was experimentally manufactured.

Figure 6:
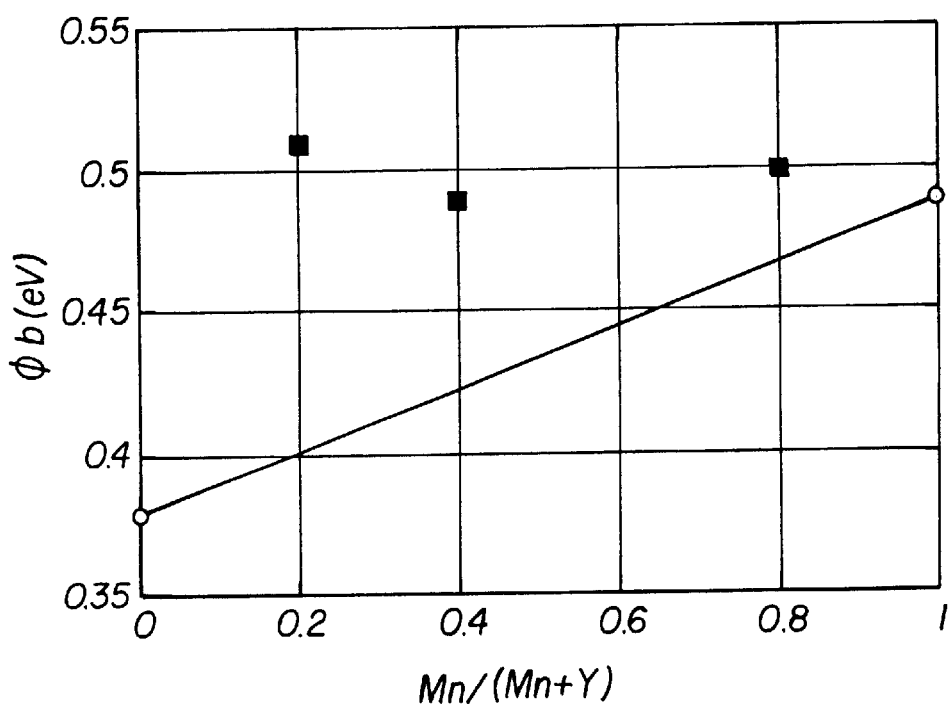
FIG. 6 is a characteristic drawing showing a relationship between the composition of an SBD, in which an Mn—Y alloy barrier is used, and $\phi b$.

FIG. 6 is a diagram of an Mn—Y system [Francis A. Shunk, "Constitution of Binary Alloys, Second Supplement"].

Figure 7:
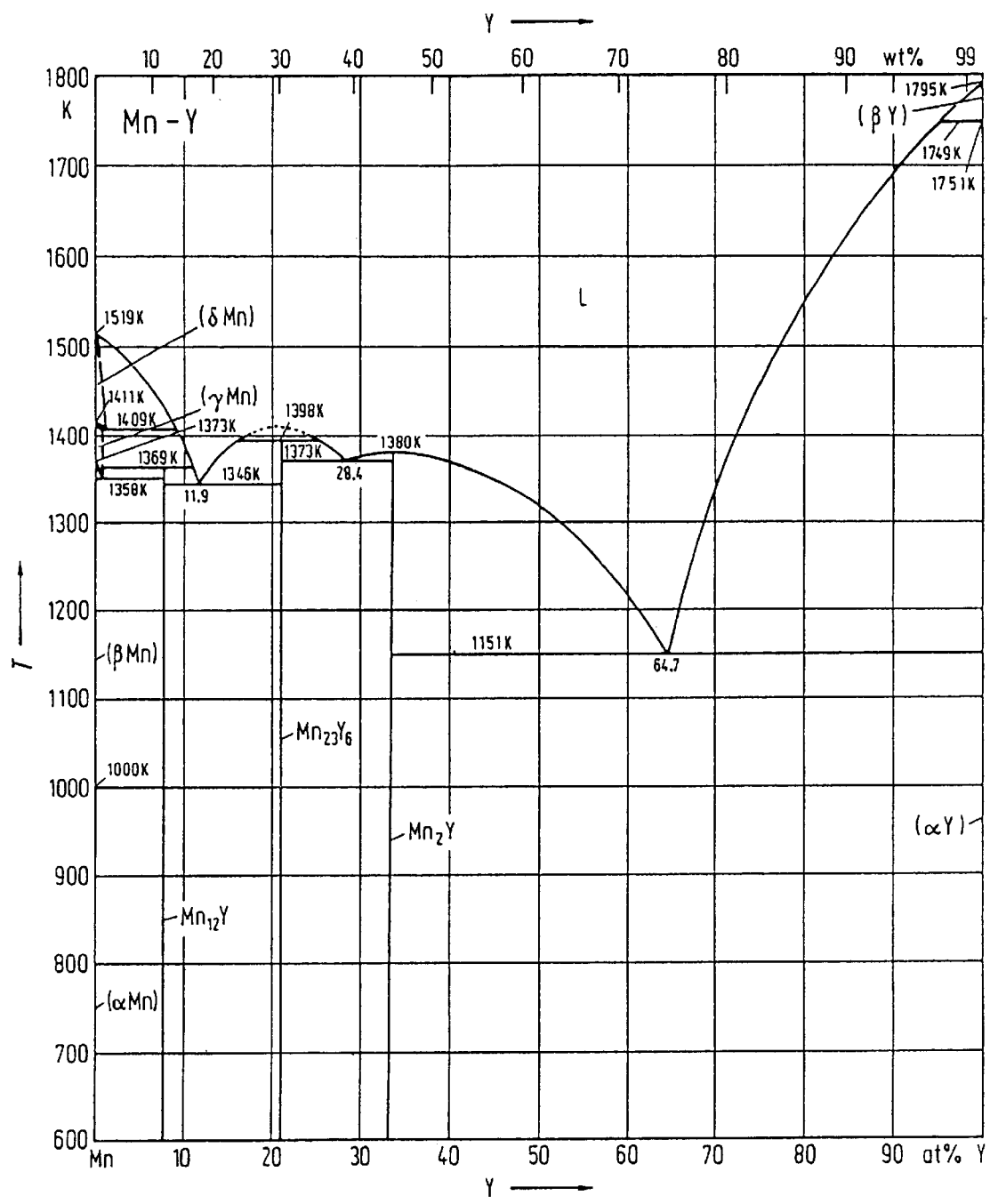
FIG. 7 is a diagram of an Mn—Y system.

As is clear from FIG. 7, Mn and Y form a variety of intermetallic compounds such as YMn$_{12}$ and Y$_6$Mn$_{23}$.

As is the case with the embodiment 1, the alloy composition ratio of the barrier metal was controlled by the vapor deposition rate, and the film composition of each sample was the same as the ratio of Ti and Y in the embodiment 1.

FIG. 6 is a characteristic drawing showing the dependency of (pb, which is calculated from current-voltage characteristics of the experimentally-manufactured SBD, on the composition of the Mn—Y alloy. For comparison, FIG. 4 also shows SBDs in which Mn or Y is singly used for the barrier metal.

Although the vapor deposition rate (composition) of Mn and Y was changed, φb of the SBD formed of the alloy did not depend on the Mn/Y ratio. φb represented a similar value to φb of Mn 100% (Y:0%). More specifically, φb of the SBD formed of the alloy does not lie between φb of the SBD formed of Mn and φb of the SBD formed of Y Therefore, φb cannot be controlled by the composition of the alloy.

Comparative Example 2

Zr and V were selected as a combination of metals that form an intermetallic compound, and an SBD, in which a Zr—V alloy was used for the barrier metal, was experimentally manufactured.

As a result, φb could not be controlled by the composition of the alloy.

Figure 8:
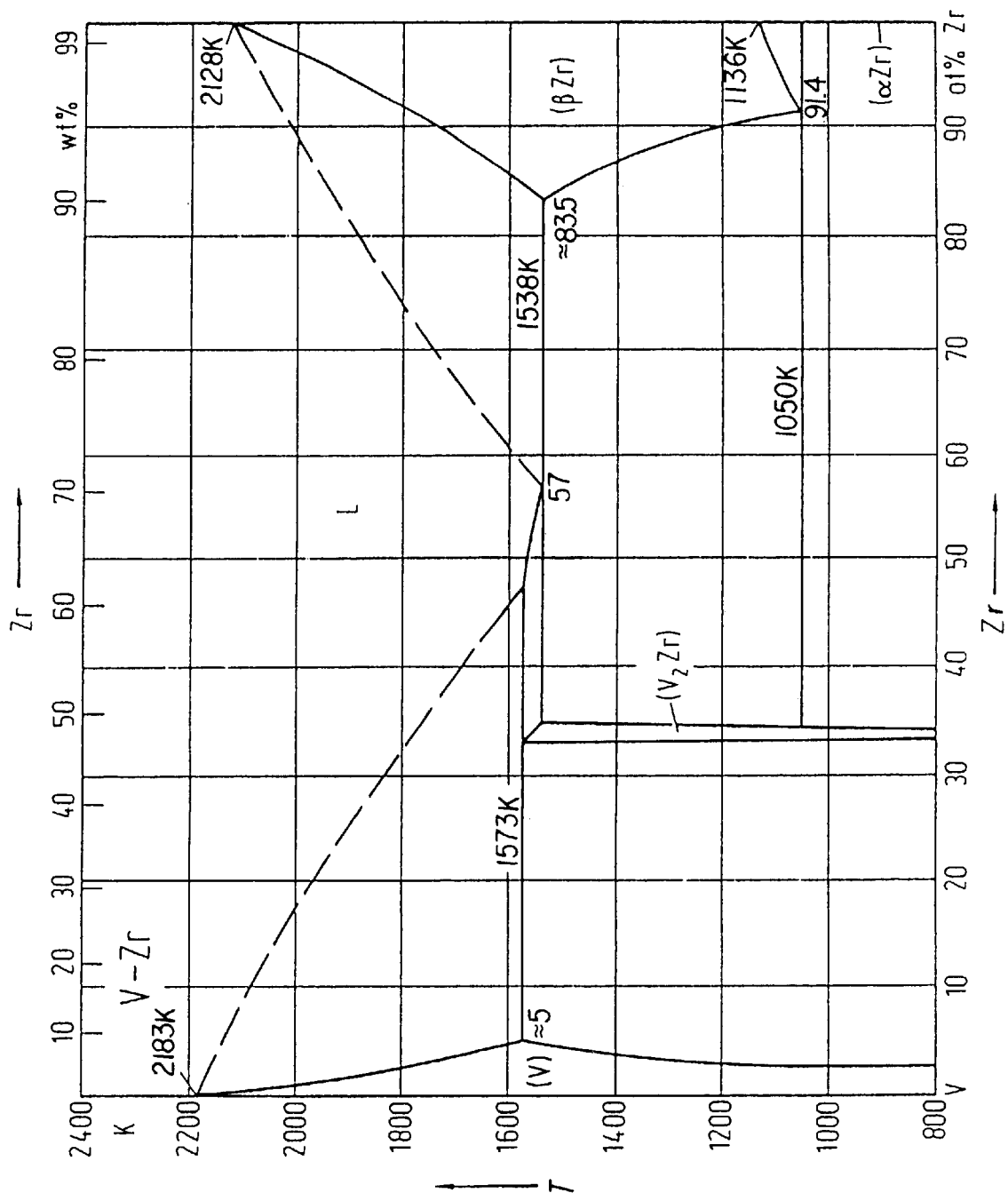
FIG. 8 is a diagram of a Zr—V system.

FIG. 8 is a constitutional diagram of a Zr—V system [the above-mentioned "Constitution of Binary Alloys, Second Supplement"].

As is clear from FIG. 8, Zr and V form an intermetallic compound V$_2$Zr.

FIG. 9 is a view showing a combination of metal elements of an alloy used for the barrier metal. A mark ● in FIG. 9 indicates a material that forms no intermetallic compound, and a mark x indicates a material that forms an intermetallic compound.

In a combination that forms no metallic compound (the mark ●), φb of the SBD that was experimentally manufactured with an alloy being used for the barrier metal linearly depended on the composition of the alloy, and φb could be controlled by the composition.

On the other hand, in the case of the SBD that was experimentally manufactured with the barrier metal formed of an alloy in a combination (x) that forms an intermetallic compound, φb was hardly changed by the change in the composition of the alloy, or φb had a poor linearity. Therefore, φb could not be controlled by the composition.

[Embodiment 4]

If a there is a great difference in φb between the SBDs, in which each of two metals of the alloy is singly used for the barrier metal, φb is sharply changed by a small difference in the composition of the alloy.

In this case, a material that represents an intermediate value between a large φb and a small φb is added to compose a ternary alloy. This makes it possible to precisely control φb.

Actually, an SBD with a barrier metal formed of an alloy composed of three metals Y, V and Mo was experimentally manufactured. The barrier metal was formed by the vapor deposition method as is the case with the embodiment 1. The composition of the alloy was changed in such a manner that the vapor deposition rate of V and Mo was kept constant whereas the vapor deposition speed of Y was changed.

As a result, the SBD showed the tendency of depending on the composition ratio $[\phi b(Y_m V_n Mo_{1-m-n}) = m\phi b(Y) + n\phi b(V) + (1-m-n)\phi b(Mo), 0 \leq m \leq 1, 0 \leq n \leq 1, 0 \leq m+n \leq 1]$ as is the case with FIG. 1. It was confirmed that $\phi b$ could be controlled in the Y—V—Mo ternary alloy.

According to the present invention as set forth hereinabove, two kinds of metals that form no intermetallic compound are used for the barrier metal, and the composition ratio of the barrier metal is changed in order to arbitrarily control $\phi b$ on the interface of the barrier metal and the semiconductor. This obtains the SBD having the forward characteristic and the backward characteristic, which cannot be obtained by the SBD in which a single metal is used for the barrier metal.

What is claimed is:

1. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of scandium and erbium, yttrium, titanium, manganese, zirconium, vanadium, chromium, tantalum, molybdenum or platinum.

2. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of erbium and yttrium, titanium, zirconium, vanadium, tantalum or molybdenum.

3. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of yttrium and titanium, zirconium, vanadium, tantalum or molybdenum.

4. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of titanium and zirconium, vanadium, chromium, nickel, tantalum or molybdenum.

5. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of manganese and vanadium, cobalt or tantalum.

6. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is a combination of zirconium and tantalum.

7. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is selected from the group consisting of:
      a combination of vanadium and chromium, tantalum or molybdenum.

8. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein a combination of two kinds of metals among metal elements constituting said barrier metal is a combination of tantalum and molybdenum.

9. A Schottky barrier diode which utilizes a Schottky barrier formed at an interface of a metal and a semiconductor, said Schottky barrier diode comprising a barrier metal formed of an alloy, which is composed of two or more metal material combinations that do not form intermetallic compound and provide different Schottky barrier heights with respect to a semiconductor and that form no intermetallic compound;
   wherein the Schottky barrier height is a straight line (linear) function of the fractional value (composition ratio) of any element in the alloy; and wherein the barrier metal is a three metal combination of yttrium, vanadium, and molybdenum.

* * * * *